US009935179B2

(12) United States Patent
Cai et al.

(10) Patent No.: US 9,935,179 B2
(45) Date of Patent: Apr. 3, 2018

(54) METHOD FOR MAKING SEMICONDUCTOR DEVICE WITH FILLED GATE LINE END RECESSES

(71) Applicants: INTERNATIONAL BUSINESS MACHINES CORPORATION, Armonk, NY (US); GLOBALFOUNDRIES, Inc., Grand Cayman (KY); STMICROELECTRONICS, INC., Coppell, TX (US)

(72) Inventors: Xiuyu Cai, Niskayuna, NY (US); Qing Liu, Irvine, CA (US); Kejia Wang, Poughkeepsie, NY (US); Ruilong Xie, Schenectady, NY (US); Chun-Chen Yeh, Clifton Park, NY (US)

(73) Assignees: INTERNATIONAL BUSINESS MACHINES CORPORATION, Armonk, NY (US); GLOBALFOUNDRIES INC., Grand Cayman (KY); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 15/472,556

(22) Filed: Mar. 29, 2017

(65) Prior Publication Data
US 2017/0200812 A1    Jul. 13, 2017

Related U.S. Application Data

(62) Division of application No. 14/281,021, filed on May 19, 2014, now Pat. No. 9,653,579.

(51) Int. Cl.
*H01L 21/336* (2006.01)
*H01L 29/66* (2006.01)
(Continued)

(52) U.S. Cl.
CPC .......... *H01L 29/66795* (2013.01); *H01L 21/823431* (2013.01); *H01L 21/823437* (2013.01);
(Continued)

(58) Field of Classification Search
CPC ..... H01L 21/823821; H01L 21/823431; H01L 29/66545; H01L 29/66795
(Continued)

(56) References Cited

U.S. PATENT DOCUMENTS 8,216,888 B2    7/2012 Chuang et al.
8,956,928 B2 *  2/2015 Jakubowski ...... H01L 29/66969
                                              438/150
(Continued)

*Primary Examiner* — Matthew Gordon
(74) *Attorney, Agent, or Firm* — Cantor Colburn LLP; Steven Meyers

(57) ABSTRACT

A method for making a semiconductor device may include forming first and second spaced apart semiconductor active regions with an insulating region therebetween, forming at least one sacrificial gate line extending between the first and second spaced apart semiconductor active regions and over the insulating region, and forming sidewall spacers on opposing sides of the at least one sacrificial gate line. The method may further include removing portions of the at least one sacrificial gate line within the sidewall spacers and above the insulating region defining at least one gate line end recess, filling the at least one gate line end recess with a dielectric material, and forming respective replacement gates in place of portions of the at least one sacrificial gate line above the first and second spaced apart semiconductor active regions.

14 Claims, 17 Drawing Sheets

(51) Int. Cl.
*H01L 29/06* (2006.01)
*H01L 27/088* (2006.01)
*H01L 21/8234* (2006.01)

(52) U.S. Cl.
CPC ...... *H01L 27/0886* (2013.01); *H01L 29/0653* (2013.01); *H01L 29/6656* (2013.01); *H01L 29/66545* (2013.01)

(58) Field of Classification Search
USPC ........................................................ 438/262
See application file for complete search history.

(56) References Cited

U.S. PATENT DOCUMENTS

| | | | |
|---|---|---|---|
| 9,276,087 B2 * | 3/2016 | Kim | H01L 29/66545 |
| 2012/0326241 A1 * | 12/2012 | Haran | H01L 21/28518 257/401 |
| 2013/0037886 A1 * | 2/2013 | Tsai | H01L 21/823821 257/351 |

* cited by examiner

METHOD FOR MAKING SEMICONDUCTOR DEVICE WITH FILLED GATE LINE END RECESSES

DOMESTIC PRIORITY

This application is a divisional of the legally related U.S. application Ser. No. 14/281,021 filed May 19, 2014, published as US20150333155A1 on Nov. 19, 2015, which is fully incorporated herein by reference.

BACKGROUND

The present invention relates to the field of electronic devices and, more particularly, to semiconductor devices and related methods.

Fin-based field effect transistors (FINFETs) are vertical transistor devices in which a semiconductor fin is located on a substrate and is used to define the source, drain, and channel regions of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

With ever-increasing device integration densities, (e.g., 10 nm and beyond), various challenges may arise with respect to both FINFET and planar semiconductor devices. For example, with increasing densities, the distances between adjacent devices becomes smaller, making the chances for inadvertent shorting between adjacent contacts greater. As such, further enhancements in semiconductor devices may be desirable in some applications, such as next generation FINFET or planar devices with relatively small dimensions, for example.

SUMMARY

A method for making a semiconductor device may include forming first and second spaced apart semiconductor active regions with an insulating region therebetween, forming at least one sacrificial gate line extending between the first and second spaced apart semiconductor active regions and over the insulating region, and forming sidewall spacers on opposing sides of the at least one sacrificial gate line. The method may further include removing portions of the at least one sacrificial gate line within the sidewall spacers and above the insulating region defining at least one gate line end recess, filling the at least one gate line end recess with a dielectric material, and forming respective replacement gates in place of portions of the at least one sacrificial gate line above the first and second spaced apart semiconductor active regions.

By way of example, the dielectric material may comprise a nitride. In accordance with one example embodiment, the dielectric material may include an outer liner comprising a nitride, an inner liner comprising a first oxide, and a second oxide within the inner liner different than the first oxide. By way of example, the first oxide may comprise hafnium oxide, and the second oxide may comprise silicon dioxide. The at least one sacrificial gate line may include a plurality of spaced apart sacrificial gate lines extending between the first and second spaced apart semiconductor active regions.

Additionally, the method may also include forming oxide regions adjacent the at least one sacrificial gate line above the insulating region after forming the sidewall spacers. Furthermore, a plurality of epitaxial regions may be formed adjacent the at least one sacrificial gate liner over the semiconductor active regions. By way of example, the insulating region may be a shallow trench isolation (STI) region. The method may further include performing a self-aligned contact etch to remove portions of the dielectric material, and forming a contact line in place of the removed portions of the dielectric material and adjacent the replacement gates.

A related semiconductor device may include first and second spaced apart semiconductor active regions with an insulating region therebetween, and at least one respective gate above the first and second spaced apart semiconductor active regions and defining a gate end line recess therebetween over the insulating region. The semiconductor device may also include a dielectric body in the end line recess above the insulating region and comprising a different material than the insulating region.

DETAILED DESCRIPTION

Figure 1:
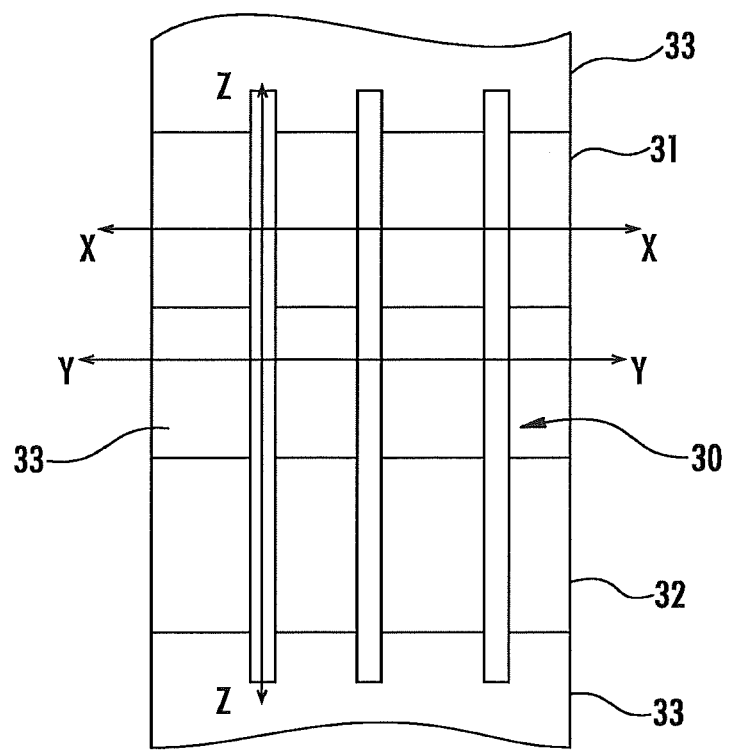
FIG. 1 is a top plan view illustrating a method for making a semiconductor device.
Figure 2:
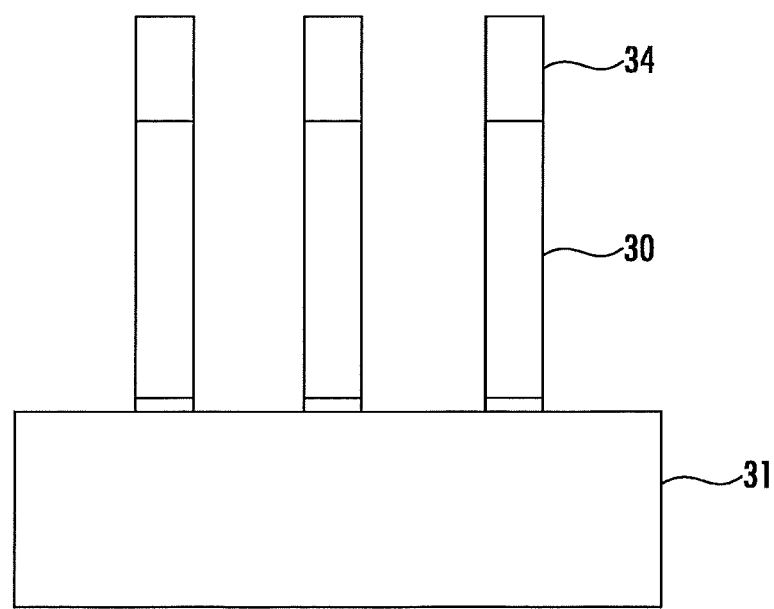
FIGS. 2, 3 and 4 are cross-sectional views taken along lines X-X, Y-Y, and Z-Z in FIG. 1, respectively.
Figure 3:
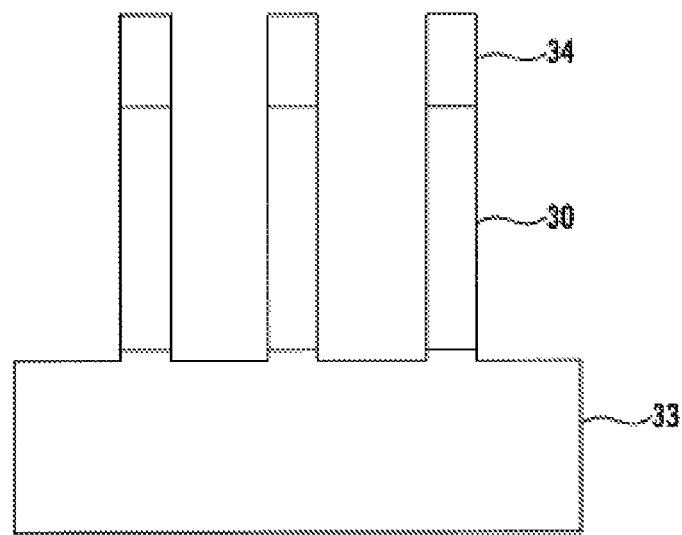
Figure 4:
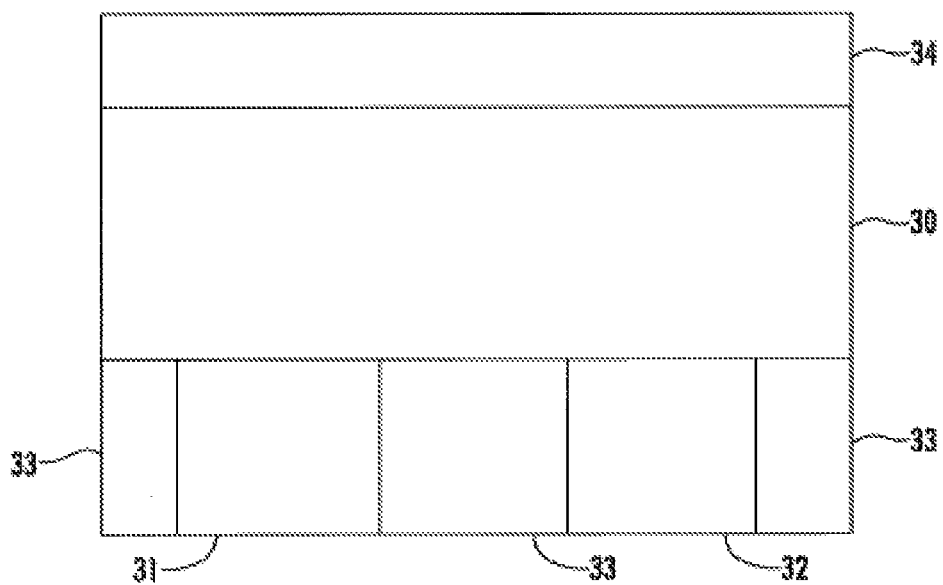

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similarly elements in different embodiments.

Referring initially to FIGS. 1, 2, 3 and 4, by way of background, sacrificial gate lines 30 (also referred to as a "PC lines") are used in FINFET integration. Due to the thinning of spacers at sacrificial gate line 30 ends where the PC lines are "cut" in between active semiconductor areas 31, 32 in typical integration approaches, defects may result from epitaxial deposition for source/drain regions. The area between the active regions 31, 32 may be an insulating region 33, such as a shallow trench isolation (STI) region, for example. Also, because of the thinning of spacers at the sacrificial gate line 30 ends, the contact reactive ion etch (RIE) may penetrate through and reach the sacrificial gate line 30, causing shorting between source/drain contacts and the sacrificial gate line 30 end. The approaches set forth herein may advantageously help protect the sacrificial gate line 30 ends from such problems. An optional layer 100 may be formed between gate line 30 and the active regions 31, 32 and between the gate line 30 and the insulating region 33.

Each of the sacrificial gate lines 30 are formed using a nitride hard mask 34 to cover the areas where the sacrificial gate lines are to remain after etching of the adjacent semiconductor material (e.g., through RIE, etc.). The sacrificial gate lines 30 extend between the spaced apart semiconductor active regions 31, 32 and over the intervening insulating region 33. By way of example, the semiconductor gate line material may be amorphous silicon, although other suitable semiconductors may be used in different embodiments. The active regions 31, 32 may be used to implement planar devices, FINFET devices, nanowire devices, etc., as will be appreciated by those skilled in the art.

Figure 5:
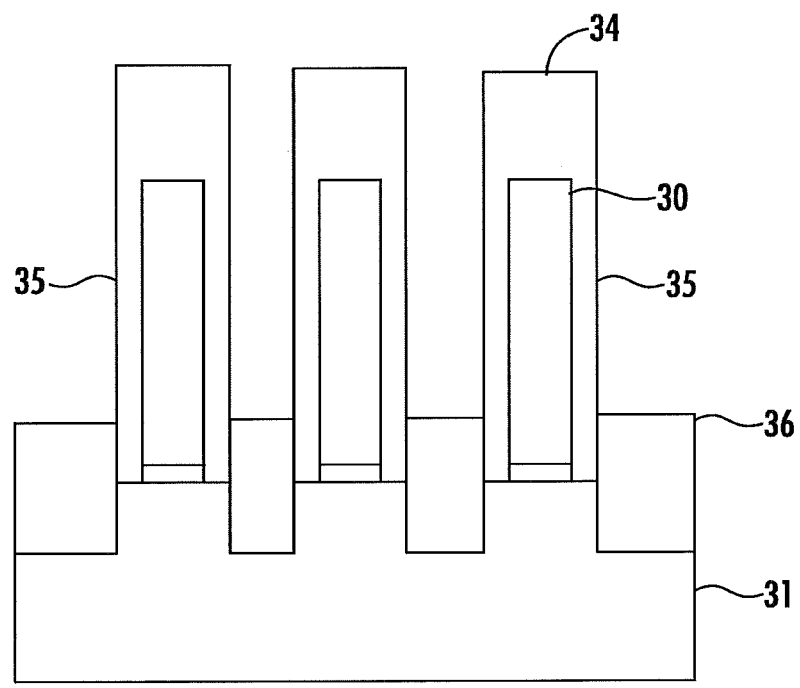
FIGS. 5, 6 and 7 are cross-sectional views similar to FIGS. 2-4, respectively, after sidewall spacer formation.
Figure 6:
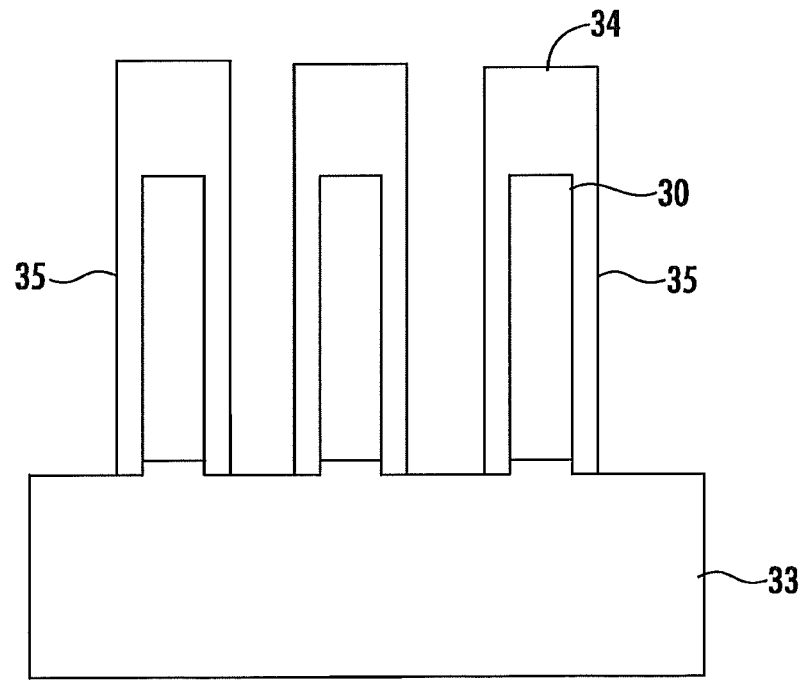
Figure 7:
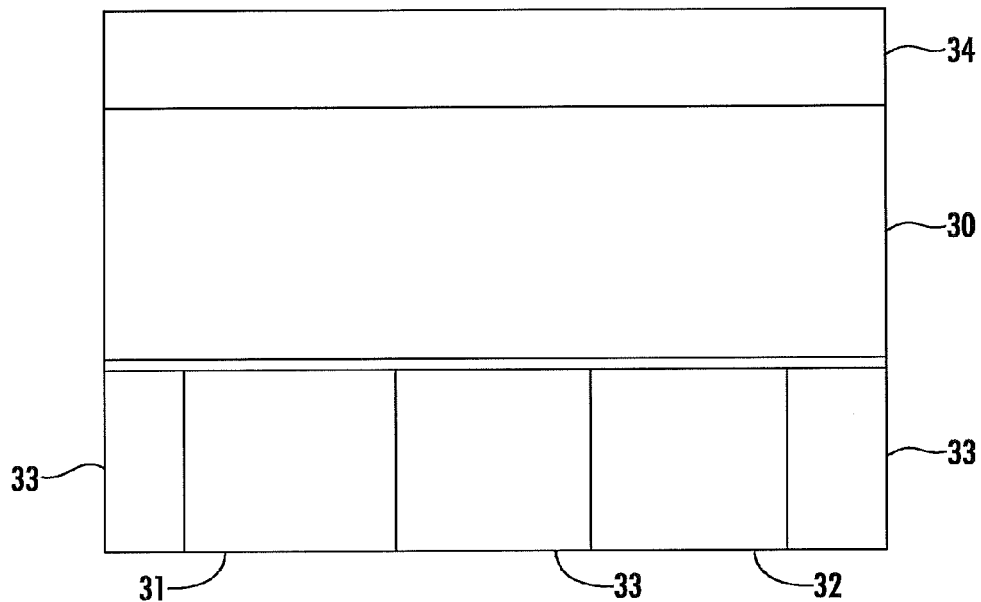

Referring additionally to FIGS. 5, 6 and 7, sidewall spacers 35 may formed on opposing sides of the sacrificial gate lines 30. By way of example, the sidewall spacers 35 may be silicon nitride spacers, for example. Furthermore, epitaxial growth of source/drain regions 36 (e.g., epitaxial silicon) may be performed after formation of the sidewall spacers 35. Doing so—as opposed to attempting to cut or sever the sacrificial gate lines 30 over the STI region 33 prior to formation of the epitaxial regions 36 at this point in the process—advantageously helps keep the line ends from being shorted by the epitaxial deposition, as will be appreciated by those skilled in the art.

Figure 8:
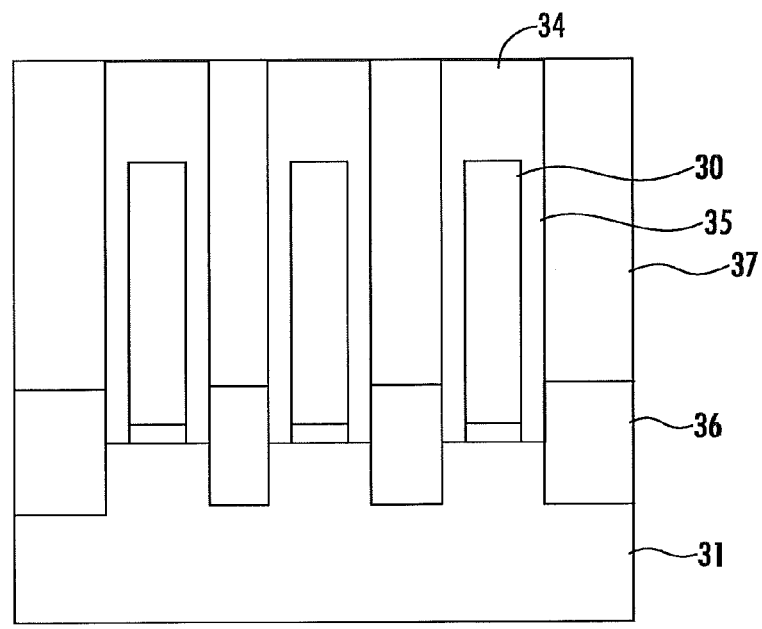
FIGS. 8, 9 and 10 are cross-sectional views similar to FIGS. 5-7, respectively, after an oxide fill.
Figure 9:
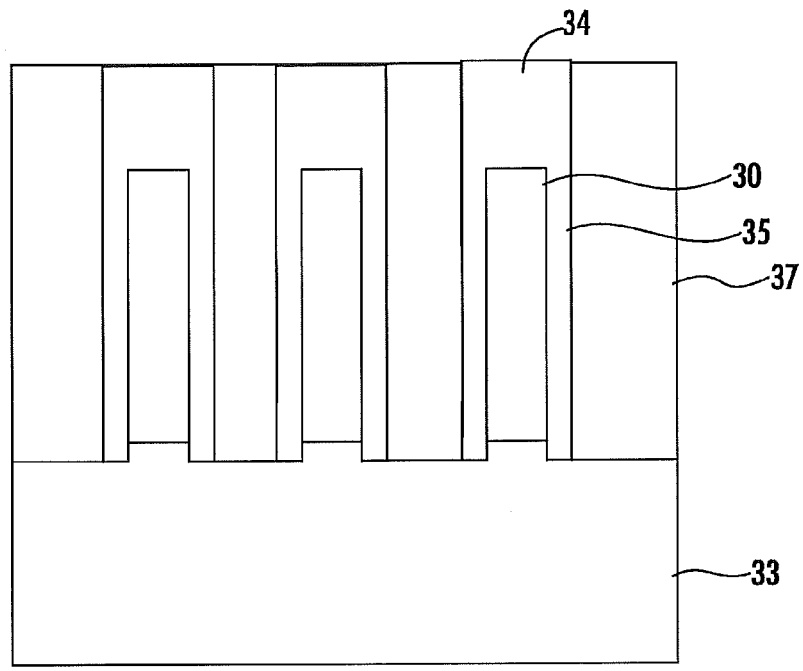
Figure 10:
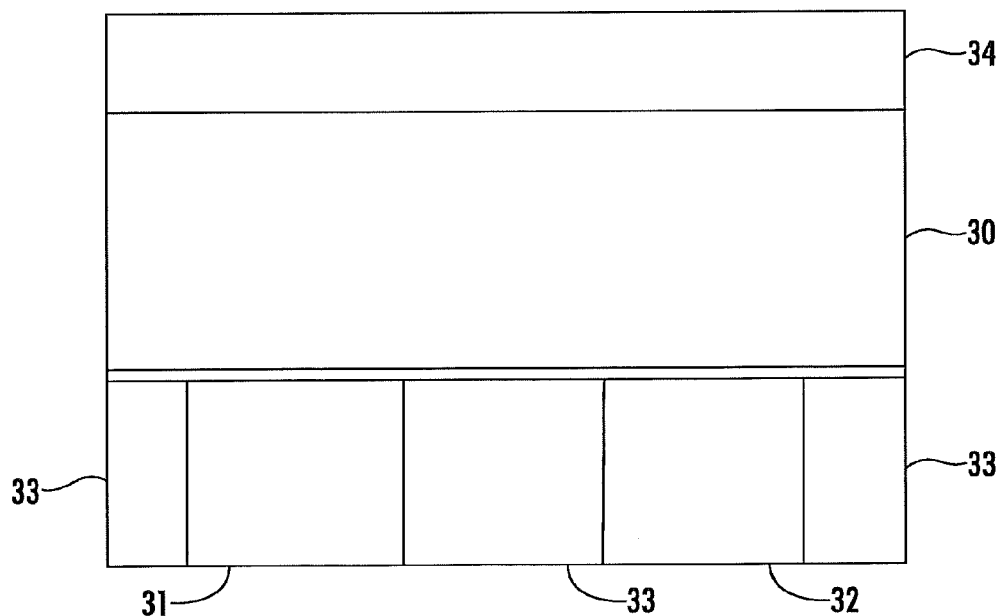
Figure 11:
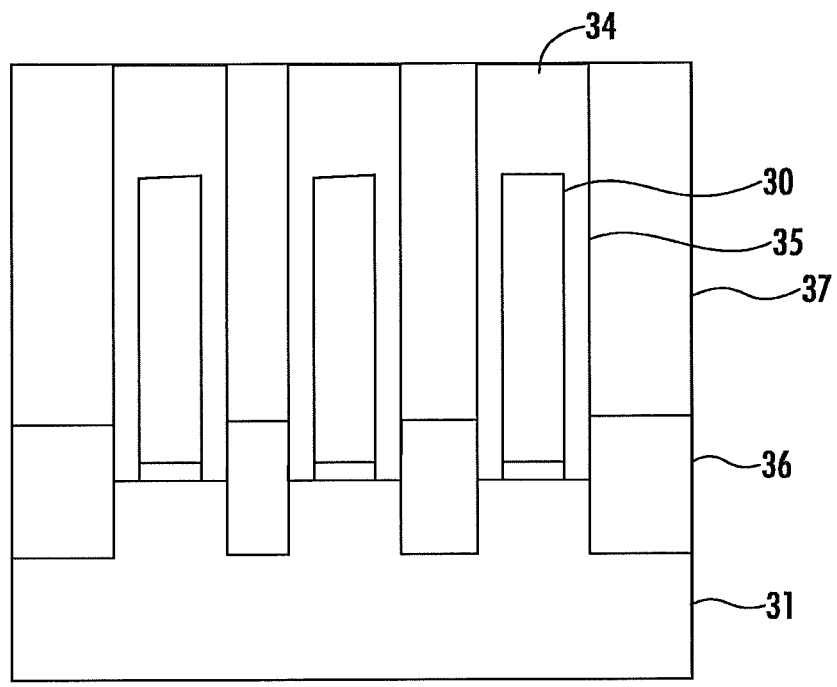
FIGS. 11, 12 and 13 are cross-sectional views similar to FIGS. 5-7, respectively, after removal of nitride hard mask portions.
Figure 12:
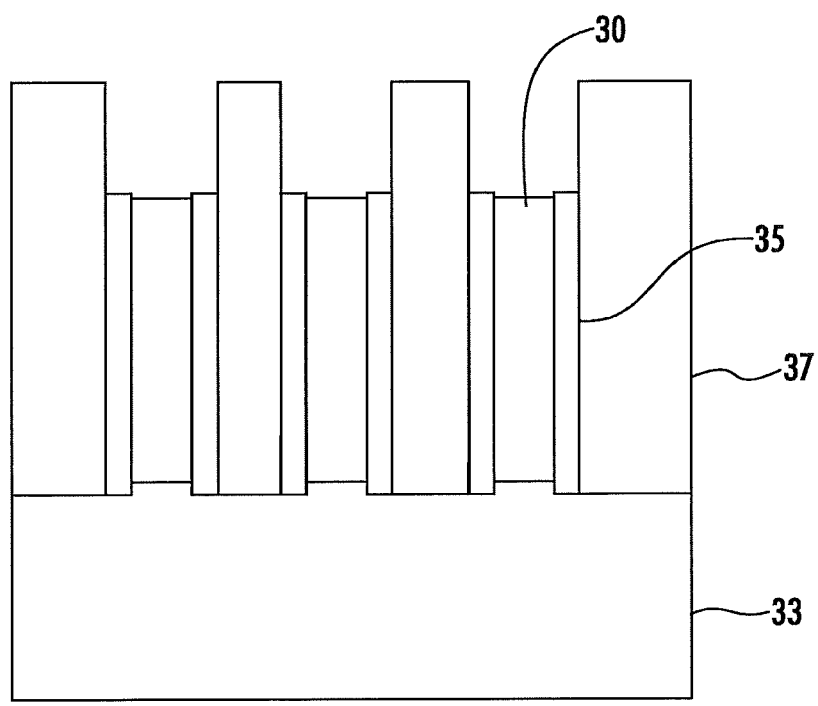
Figure 13:
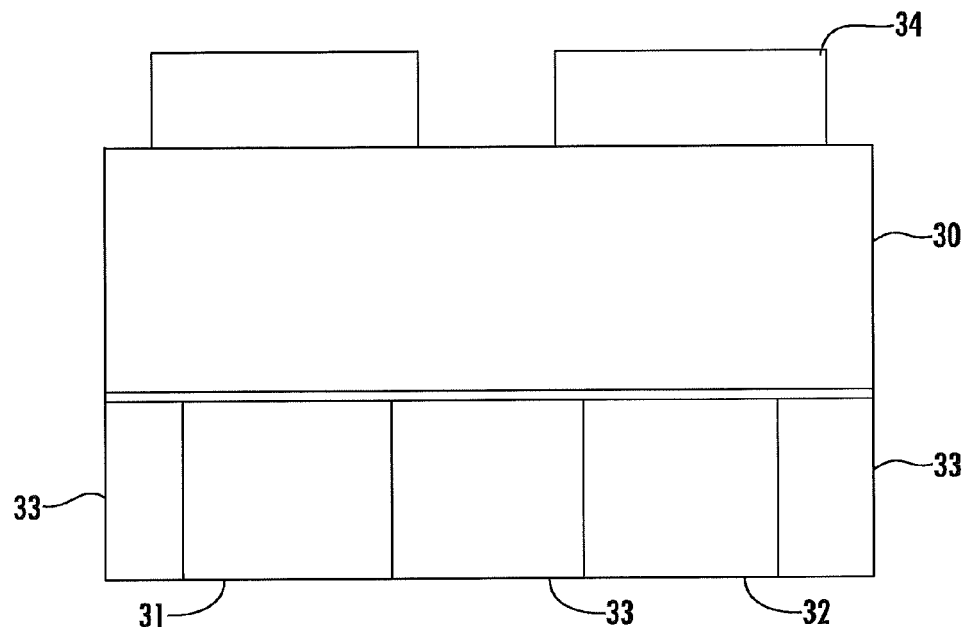
Figure 14:
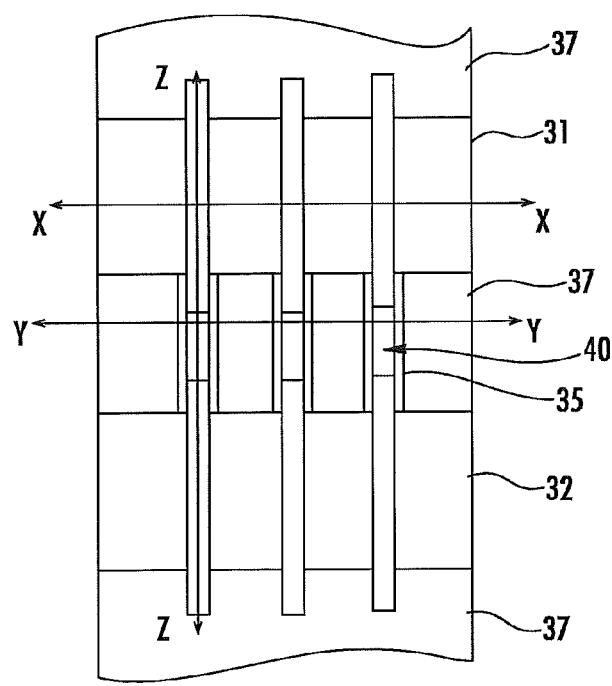
FIG. 14 is a top plan view similar to FIG. 1 after removal of sacrificial gate line portions.
Figure 15:
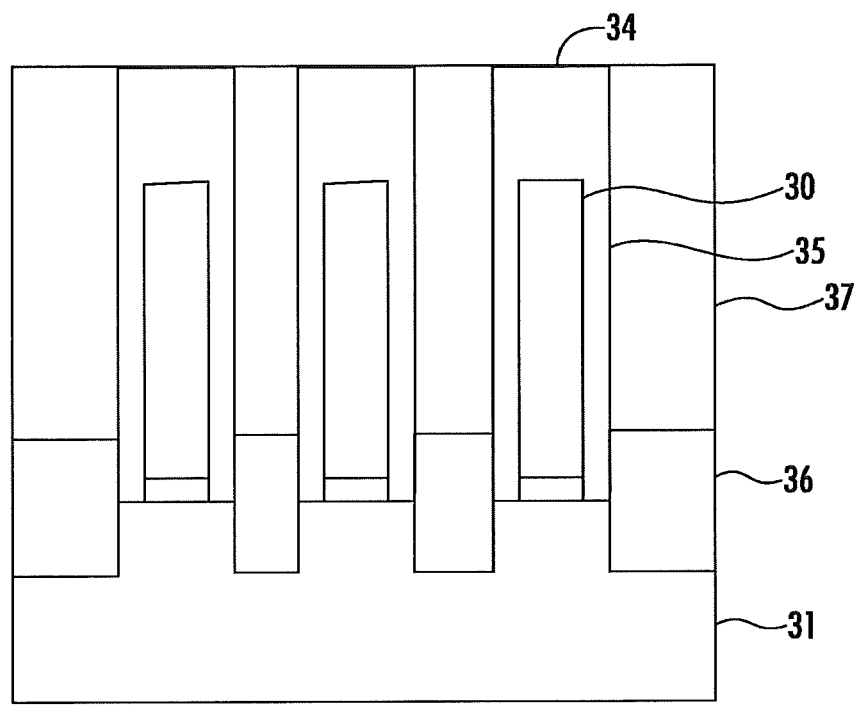
FIGS. 15, 16 and 17 are cross-sectional views taken along lines X-X, Y-Y, and Z-Z in FIG. 14, respectively.
Figure 16:
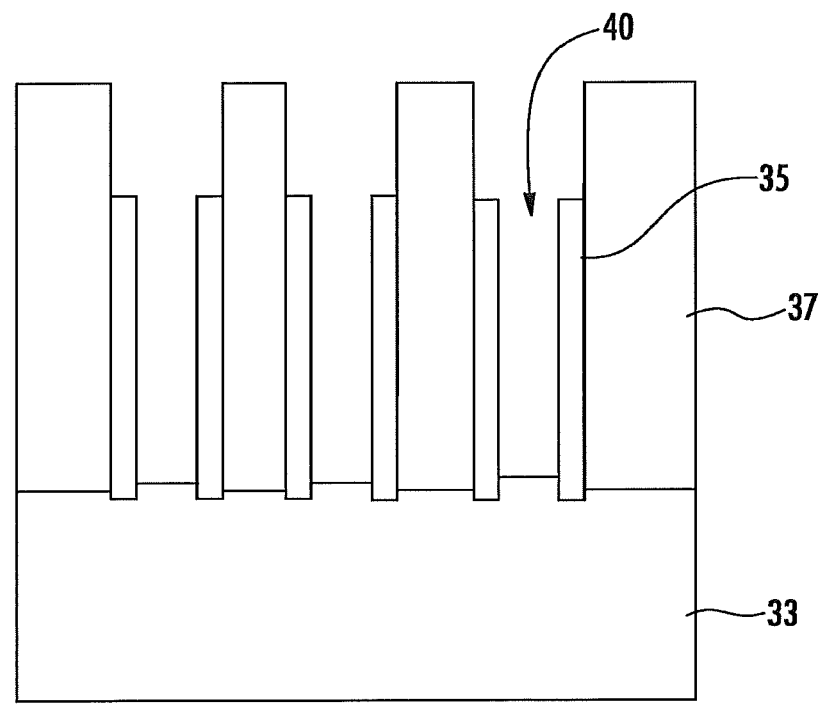
Figure 17:
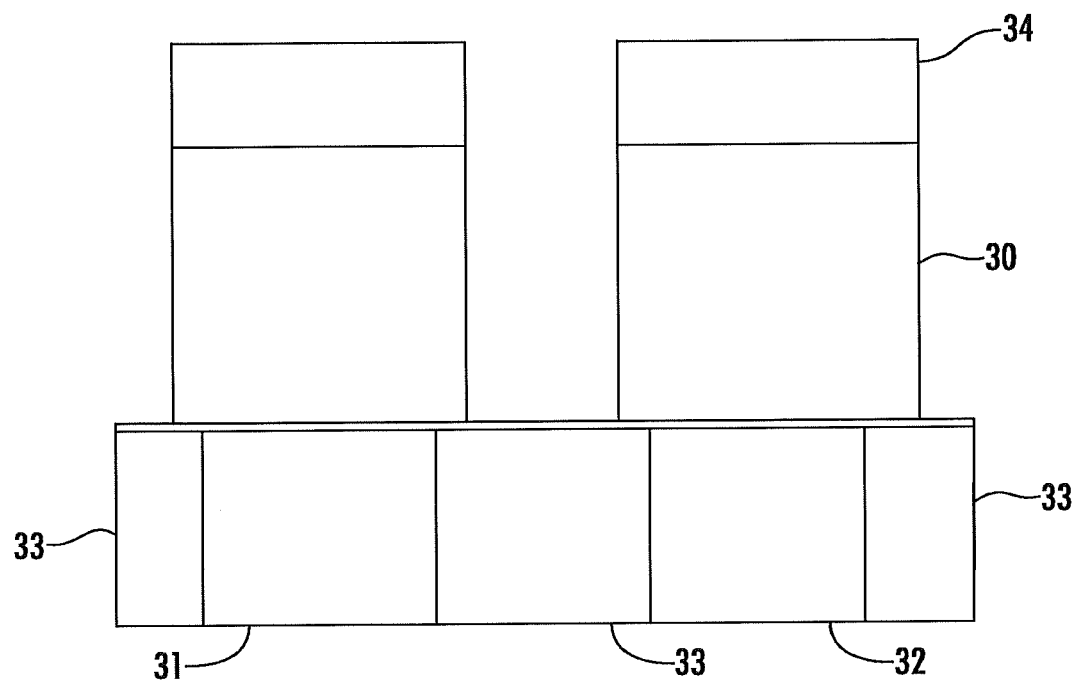
Figure 18:
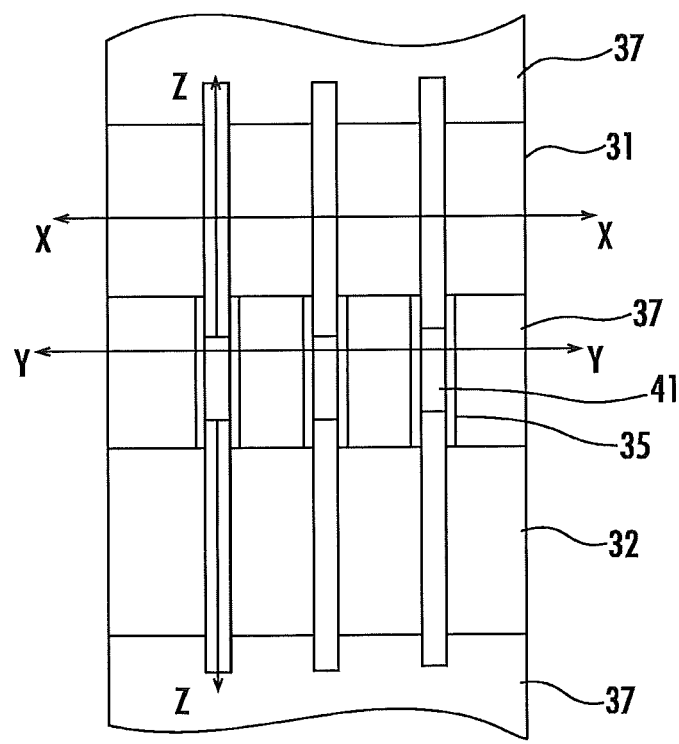
FIG. 18 is a top plan view similar to FIG. 14 after gate line end recess filling.
Figure 19:
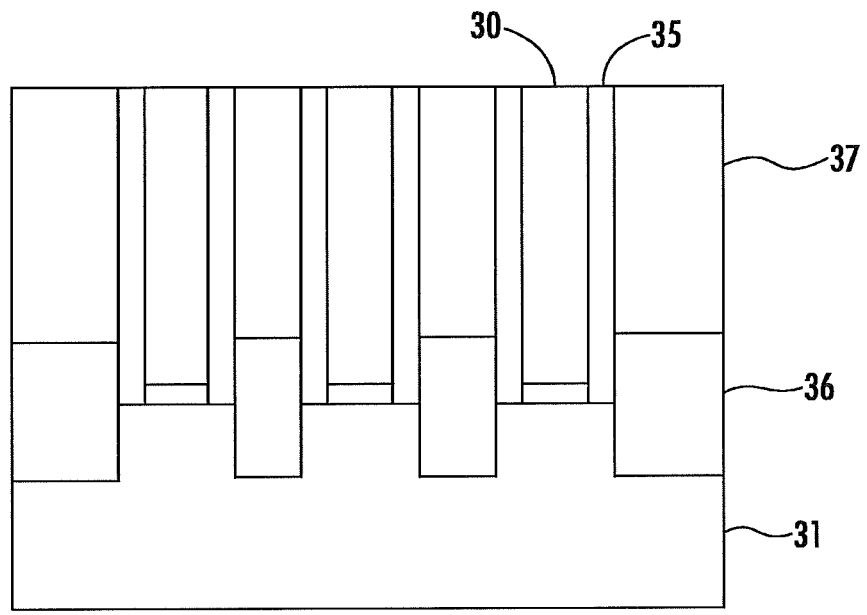
FIGS. 19, 20, and 22 are cross-sectional views taken along lines X-X, Y-Y, and Z-Z in FIG. 18, respectively.

Referring to FIGS. 8, 9 and 10, an oxide 37 (e.g., SiO2) may be formed to fill between adjacent spacers 35 and sacrificial gate lines 30, followed by a planarizing step (e.g., chemical mechanical polishing (CMP)) to planarize the oxide at the surface level of the nitride mask 34. Furthermore, portions of the SiN hard mask 34 covering the sacrificial gate lines 30 over the STI region 33 between the active regions 31, 32 may then be removed to expose the sacrificial gate lines where they are to be "cut" or separated, as seen in FIGS. 11, 12 and 13.

Figure 20:
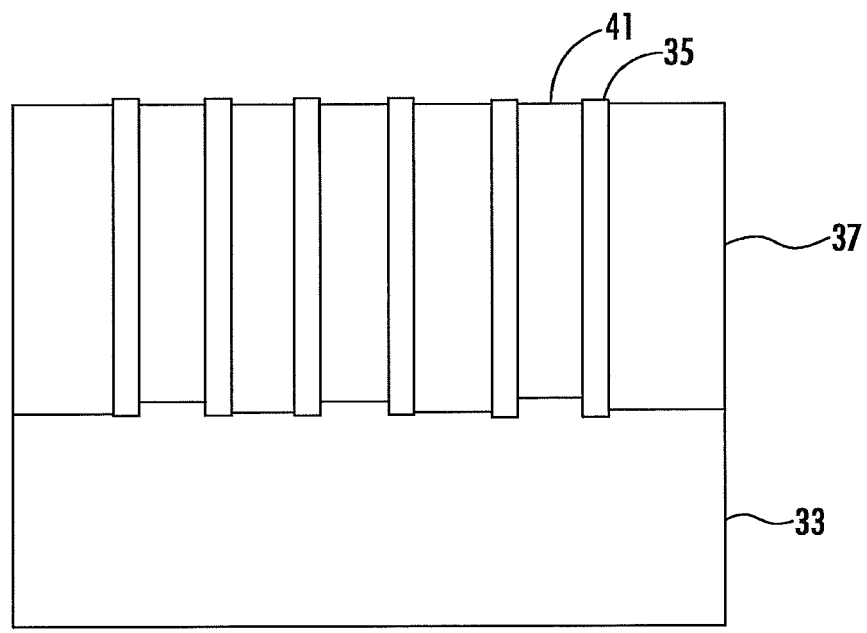
Figure 21:
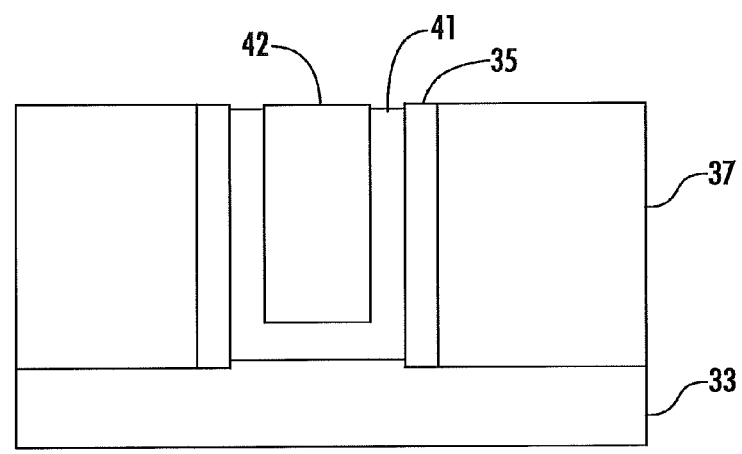
FIG. 21 is a cross-sectional view similar to that of FIG. 20 but for a larger gate line end recess.
Figure 22:
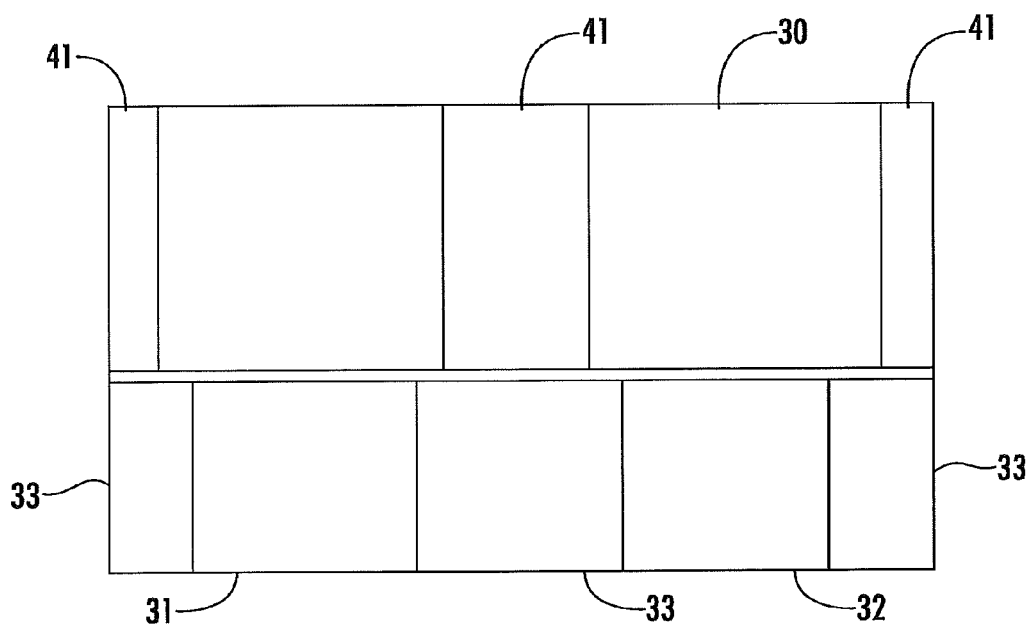
Figure 23:
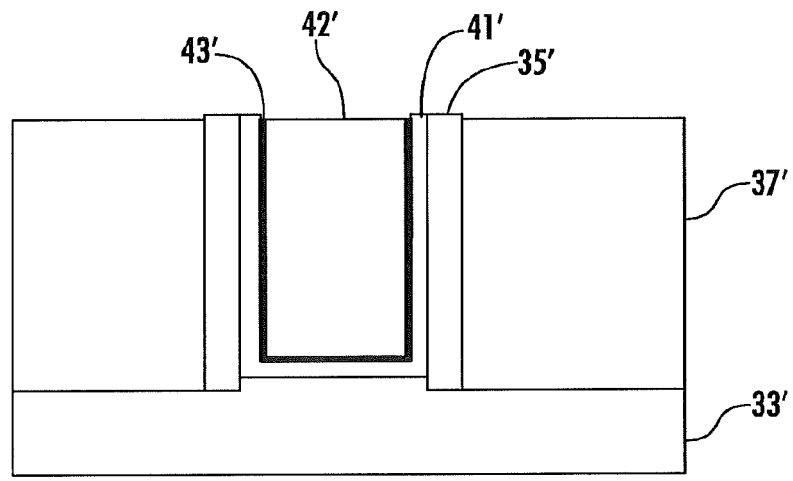
FIGS. 23 and 24 are cross-sectional views of another embodiment taken along lines Y-Y, and Z-Z in FIG. 18 including a hafnium oxide liner in the gate line end recess.
Figure 24:
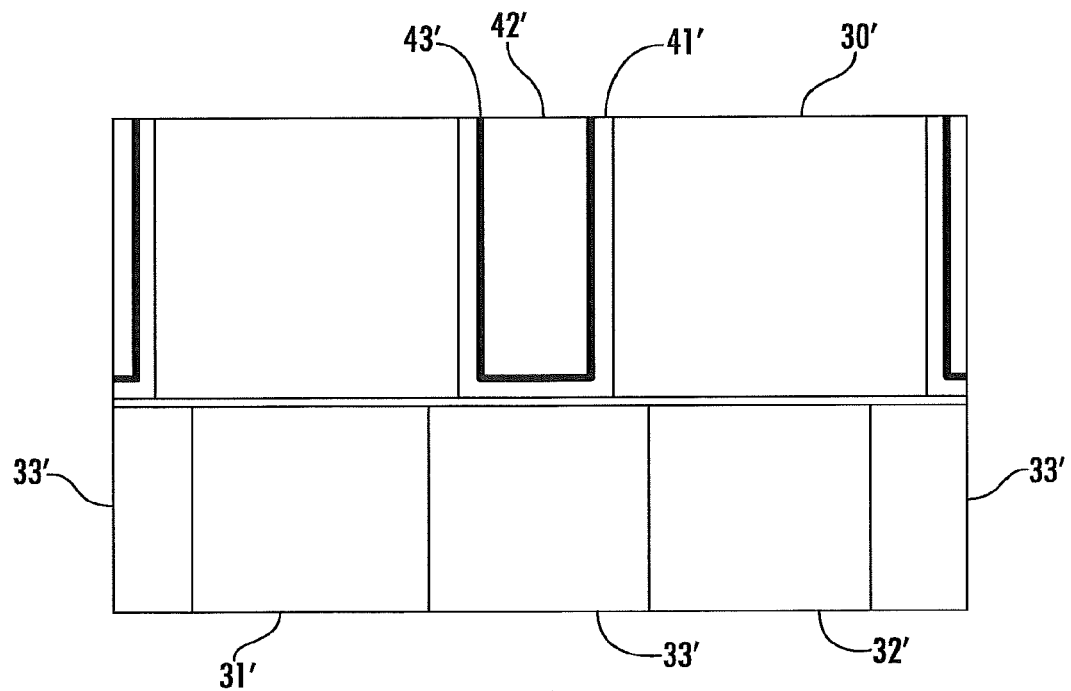

With reference to FIGS. 14, 15, 16 and 17, the exposed portions of the sacrificial gate lines 30 within the sidewall spacers 35 and above the insulating region 33 between the first and second active regions 31, 32 may be removed to define gate line end recesses 40. This severs or cuts the sacrificial gate lines 30 so that there is no longer a connection across the insulating region 33. Referring additionally to FIGS. 18, 19, 20, 21 and 22, the gate line end recesses 40 may then be filled with a dielectric material 41, such as silicon nitride in the illustrated example (FIG. 20). In some embodiments, such as for relatively large node implementations or for larger devices present on the same wafer, a larger gate line end recess 40 may be created from the larger sacrificial gate line 30, in which the silicon nitride 41 may be a liner within the recess, and another dielectric material 42 (e.g., SiO2) may be filled within the nitride liner, as shown in FIG. 21. CMP processing may also be used to planarize down to the level of the sacrificial gate line 30 portions.

In accordance with another example embodiment shown in FIGS. 23, 24, 25, 26, 27, 28, 29, 30, 31, 32, 33 and 34, a different configuration may be used for the gate line end recess 40 fill. Here, the fill includes an outer nitride (e.g., SiN) liner 41', an inner liner 43' of a first oxide (e.g., hafnium oxide, HfO2), and a second oxide 42' (e.g., SiO2) within the inner liner. It should be noted, however, that in the above-described embodiments, different liner materials may be used in place of SiN (e.g., SiBCN, SiOCN, etc.) and HfO2 (e.g., HfSiOx, Al2O3, etc.). Moreover, while the examples used herein are silicon devices, it will be appreciated that the techniques presented may be used with other semiconductor configurations, including silicon germanium, III-V materials, etc.

Figure 25:
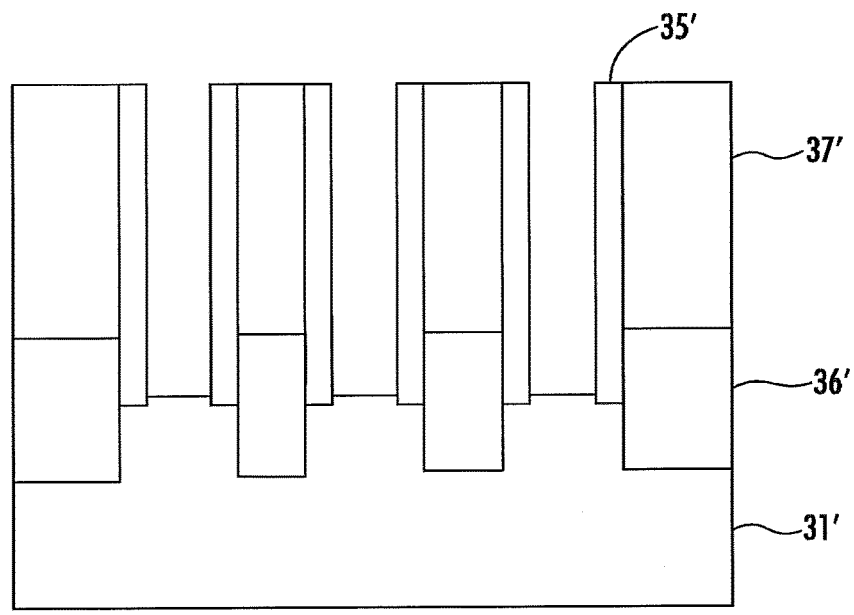
FIGS. 25, 26 and 27 are cross-sectional views taken along lines X-X, Y-Y, and Z-Z in FIG. 18 of the hafnium oxide liner embodiment after removal of sacrificial gate line portions over the active regions.
Figure 26:
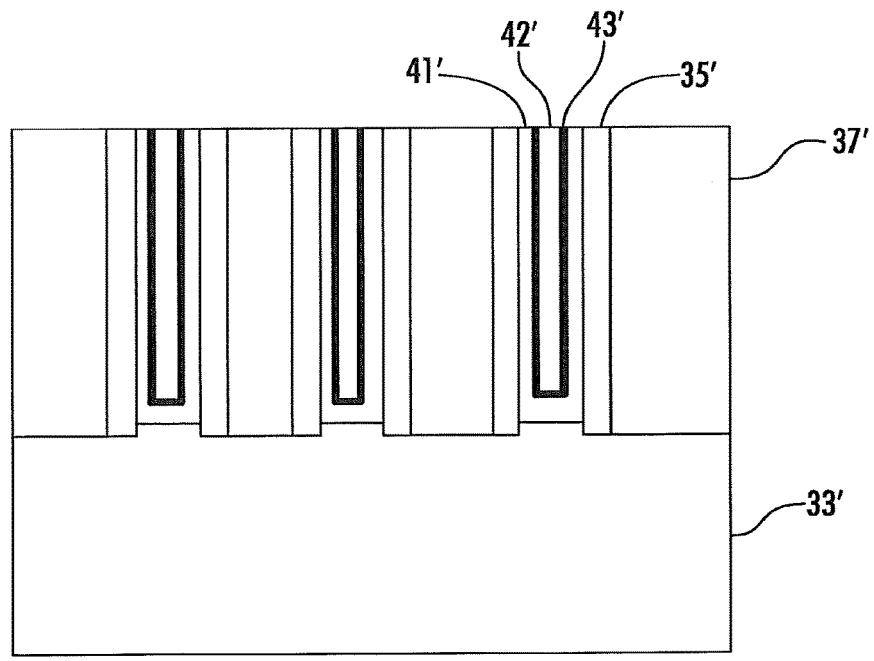
Figure 27:
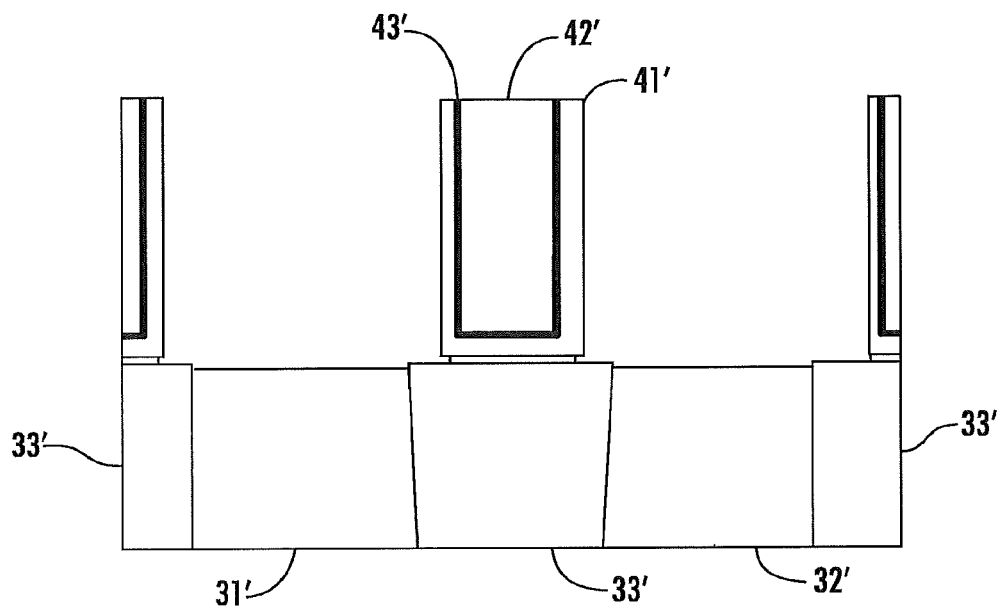
Figure 28:
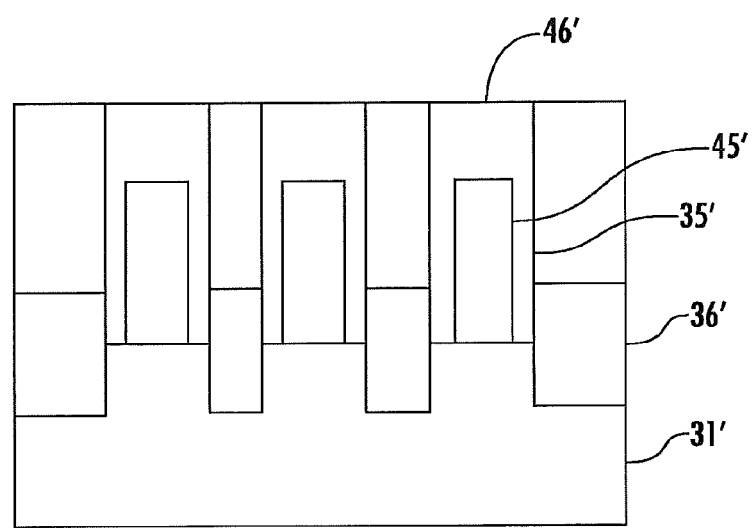
FIGS. 28-30 are cross-sectional views taken along lines X-X, Y-Y, and Z-Z in FIG. 18 of the hafnium oxide liner embodiment after formation of replacement gates.
Figure 29:
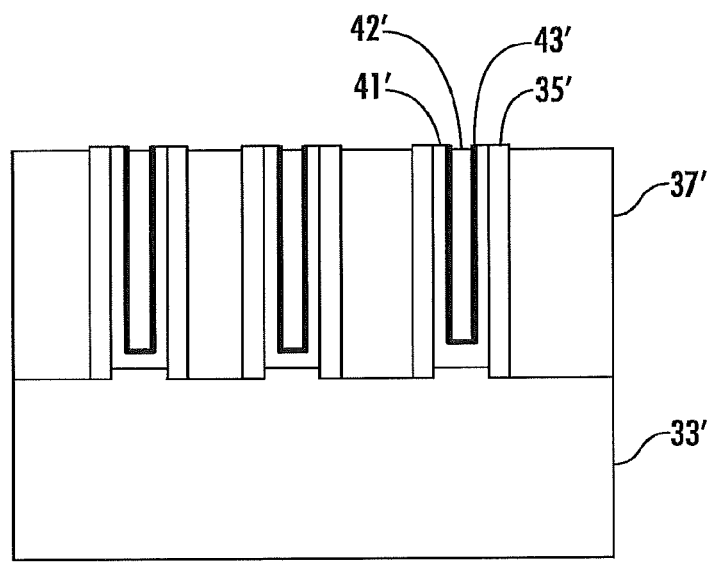
Figure 30:
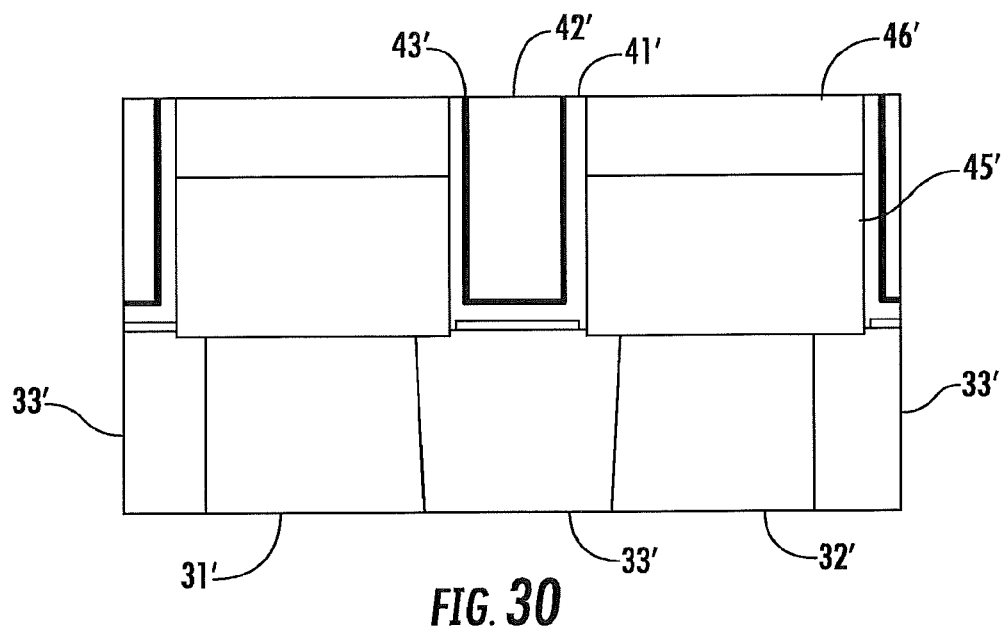
Figure 31:
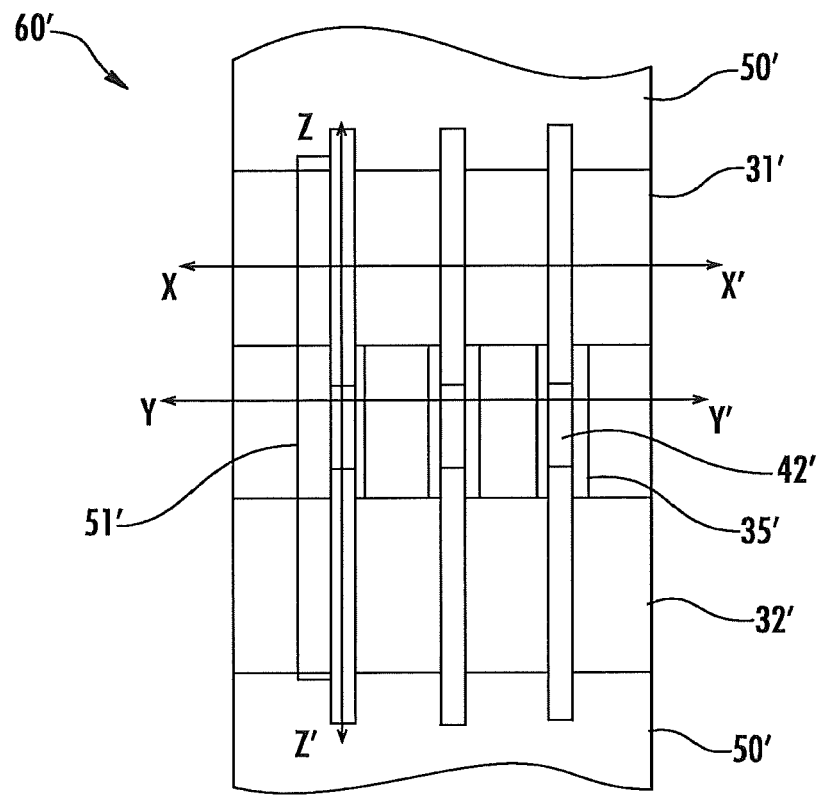
FIG. 31 is a top plan view similar to FIG. 18 after self-aligned contact formation for the hafnium oxide liner embodiment.
Figure 32:
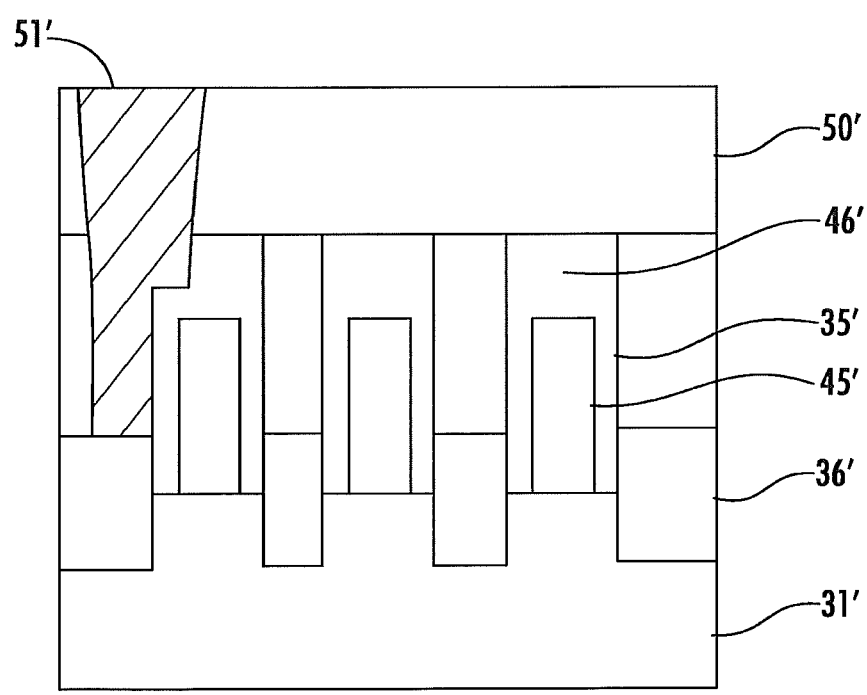
FIGS. 32, 33 and 34 are cross-sectional views respectively taken along lines X-X, Y-Y, and Z-Z in FIG. 31.
Figure 33:
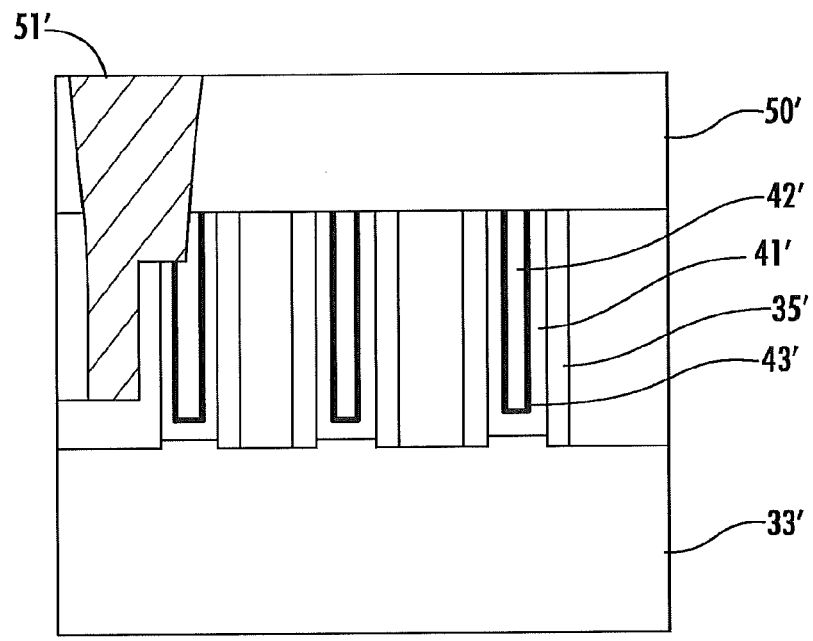
Figure 34:
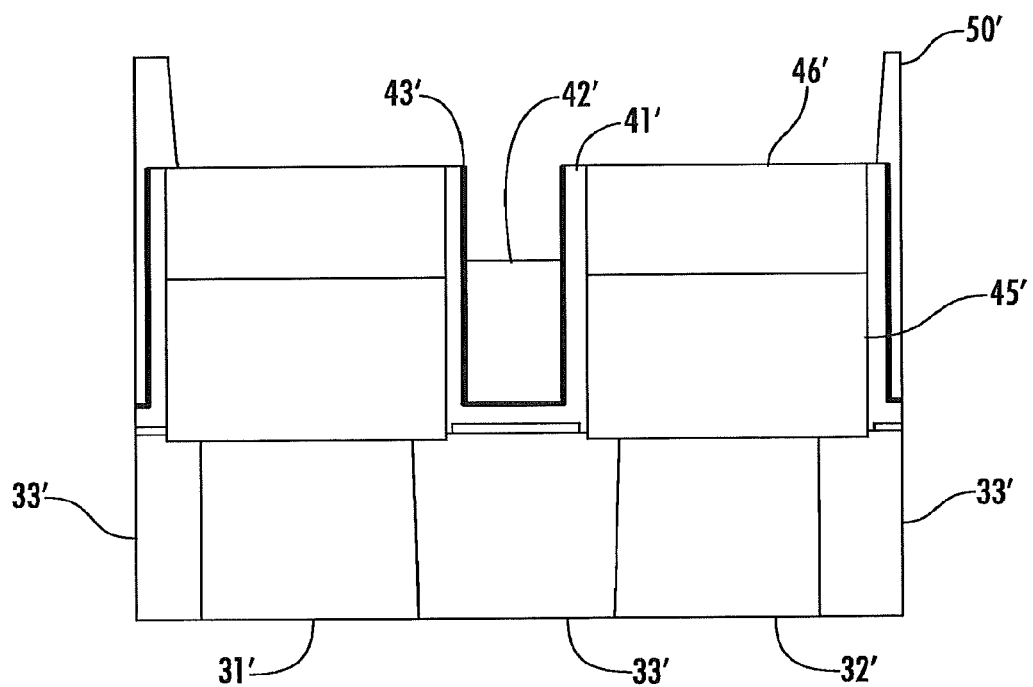

Continuing with this example, referring to FIGS. 25, 26 and 27, the remaining portions of the sacrificial gate lines 30' above the active regions 31', 32' (which have served as a "dummy" gate up onto this point) and any underlying oxide may then be removed or etched away from above the active regions as shown. Replacement gates 45', such as high K metal gates, may then be formed over the active regions 31', 32', along with respective caps 46' (e.g., SiN), as seen in FIGS. 28, 29 and 30. An oxide 50' deposition, followed by a self-aligned contact (SAC) etch to form source/drain contacts 51' (e.g., silicide, etc.), may then be performed to complete the semiconductor device 60' shown in FIGS. 31, 32, 33 and 34.

Thus, the above-described approaches provide for "cleaner" line ends which are less susceptible to shorting from epitaxial source/drain region deposition, for example. Moreover, the dielectric spacer provided over the STI regions and between the replacement gates may advantageously help provide desired isolation and leakage prevention characteristics, as will be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. A method for making a semiconductor device comprising:
    forming first and second spaced apart semiconductor active regions with an insulating region therebetween;
    forming at least one sacrificial gate line extending between the first and second spaced apart semiconductor active regions and over the insulating region;
    forming sidewall spacers on opposing sides of the at least one sacrificial gate line;
    removing a portion of each sacrificial gate line, an entirety of each portion being within the sidewall spacers, above the insulating region, and between the first and second spaced apart semiconductor active regions, defining at least one gate line end recess;
    filling the at least one gate line end recess with a dielectric material;

forming respective replacement gates in place of portions of the at least one sacrificial gate line above the first and second spaced apart semiconductor active regions; and forming a source and drain contact on the respective replacement gates and in an opening between the replacement gates.

2. The method of claim 1 wherein the dielectric material comprises a nitride.

3. The method of claim 1 wherein the dielectric material comprises an outer liner comprising a nitride, an inner liner comprising a first oxide, and a second oxide within the inner liner different than the first oxide.

4. The method of claim 3 wherein the first oxide comprises hafnium oxide, and wherein the second oxide comprises silicon dioxide.

5. The method of claim 1 wherein the at least one sacrificial gate line comprises a plurality of spaced apart sacrificial gate lines extending between an entirety of a distance between the first and second spaced apart semiconductor active regions.

6. The method of claim 1 further comprising forming oxide regions adjacent the at least one sacrificial gate line above the insulating region after forming the sidewall spacers.

7. The method of claim 1 further comprising forming a plurality of epitaxial regions adjacent the at least one sacrificial gate line over the semiconductor active regions.

8. The method of claim 1 wherein the insulating region comprises a shallow trench isolation (STI) region.

9. A method for making a semiconductor device comprising:
forming first and second spaced apart semiconductor active regions with an insulating region therebetween;
forming a plurality of sacrificial gate lines extending between the first and second spaced apart semiconductor active regions and over the insulating region;
forming respective sidewall spacers on opposing sides of the sacrificial gate lines;
forming oxide regions on opposing sides of the sidewall spacers;
removing a portion of each of the sacrificial gate lines, an entirety of each portion being within the sidewall spacers, above the insulating region, and between the first and second spaced apart semiconductor active regions, defining a plurality of gate line end recesses;
filling the gate line end recesses with a dielectric material;
forming respective replacement gates in place of portions of the sacrificial gate lines above the first and second spaced apart semiconductor active regions; and forming a source and drain contact on the respective replacement gates and in an opening between the replacement gates.

10. The method of claim 9 wherein the dielectric material comprises a nitride.

11. The method of claim 9 wherein the dielectric material comprises an outer liner comprising a nitride, an inner liner comprising a first oxide, and a second oxide within the inner liner different than the first oxide.

12. The method of claim 11 wherein the first oxide comprises hafnium oxide, and wherein the second oxide comprises silicon dioxide.

13. The method of claim 9 further comprising forming a plurality of epitaxial regions adjacent the sacrificial gate lines over the semiconductor active regions.

14. The method of claim 9 wherein the insulating region comprises a shallow trench isolation (STI) region.

* * * * *